United States Patent
Long et al.

(10) Patent No.: US 9,128,568 B2
(45) Date of Patent: Sep. 8, 2015

(54) CAPACITIVE TOUCH PANEL WITH FPC CONNECTOR ELECTRICALLY COUPLED TO CONDUCTIVE TRACES OF FACE-TO-FACE ITO PATTERN STRUCTURE IN SINGLE PLANE

(75) Inventors: Ding Hua Long, Shenzhen (CN); Hai Hui Zhang, Shenzhen (CN); Hai Long Zhang, Shenzhen (CN)

(73) Assignee: New Vision Display (Shenzhen) CO., Limited, Shenzhen (CN)

( * ) Notice: Subject to any disclaimer, the term of this patent is extended or adjusted under 35 U.S.C. 154(b) by 1268 days.

(21) Appl. No.: 12/501,840

(22) Filed: Jul. 13, 2009

(65) Prior Publication Data

US 2010/0026659 A1 Feb. 4, 2010

Related U.S. Application Data

(60) Provisional application No. 61/084,877, filed on Jul. 30, 2008, provisional application No. 61/087,015, filed on Aug. 7, 2008.

(51) Int. Cl.
*G06F 3/044* (2006.01)
*B32B 17/10* (2006.01)
*H05K 3/36* (2006.01)

(52) U.S. Cl.
CPC .......... *G06F 3/044* (2013.01); *B32B 17/10036* (2013.01); *B32B 17/10247* (2013.01); *B32B 17/10807* (2013.01); *H05K 3/361* (2013.01)

(58) Field of Classification Search
USPC .......................................................... 349/12
See application file for complete search history.

(56) References Cited

U.S. PATENT DOCUMENTS

| 4,290,052 | A | 9/1981 | Eichelberger et al. |
| 4,550,221 | A | 10/1985 | Mabusth |
| 5,062,198 | A | 11/1991 | Sun |
| 5,379,057 | A | 1/1995 | Clough et al. |
| 5,459,463 | A | 10/1995 | Gruaz et al. |

(Continued)

FOREIGN PATENT DOCUMENTS

| CN | 1838151 A | 9/2006 |
| CN | 101122839 A | 2/2008 |

(Continued)

OTHER PUBLICATIONS

International Search Report, WIPO, pp. 5-7, Date Mailed: Mar. 16, 2010.

(Continued)

*Primary Examiner* — Lauren Nguyen
(74) *Attorney, Agent, or Firm* — Robert G. Crouch; Johnathon A. Szumny; Marsh Fischmann & Breyfogle LLP

(57) ABSTRACT

A capacitive touch screen panel includes top and bottom ITO coated glass sheets that may both be connected to detection electronics (e.g., a controller) by way of a single, normal flexible printed circuit connector. The ITO coated surface of each of the top and bottom glass sheets may face each other and a transparent material such as an optically clear adhesive may be disposed between the top and bottom glass sheets. In some embodiments, a number of spacers may be disposed between the top and bottom glass sheets to maintain a desired gap between the sheets. In other embodiments, the single, normal flexible printed circuit connector may generally reside in a single plane.

10 Claims, 9 Drawing Sheets

(56) References Cited

U.S. PATENT DOCUMENTS

| | | | |
|---|---|---|---|
| 5,488,204 | A | 1/1996 | Mead et al. |
| 5,495,077 | A | 2/1996 | Miller et al. |
| 5,543,588 | A | 8/1996 | Bisset et al. |
| 5,543,590 | A | 8/1996 | Gillespie et al. |
| 5,543,592 | A | 8/1996 | Gaultier et al. |
| 5,650,597 | A | 7/1997 | Redmayne |
| 5,675,362 | A | 10/1997 | Clough et al. |
| 5,730,165 | A | 3/1998 | Philipp |
| 5,825,352 | A | 10/1998 | Bisset et al. |
| 5,838,412 | A * | 11/1998 | Ueda et al. ............... 349/150 |
| 5,841,078 | A | 11/1998 | Miller et al. |
| 5,844,506 | A | 12/1998 | Binstead |
| 5,854,450 | A | 12/1998 | Kent |
| 5,854,625 | A | 12/1998 | Frisch et al. |
| 5,861,583 | A | 1/1999 | Schediwy et al. |
| 5,880,411 | A | 3/1999 | Gillespie et al. |
| 5,920,310 | A | 7/1999 | Faggin et al. |
| 5,940,065 | A | 8/1999 | Babb et al. |
| 5,943,052 | A | 8/1999 | Allen et al. |
| 6,091,406 | A | 7/2000 | Kambara et al. |
| 6,188,391 | B1 | 2/2001 | Seely et al. |
| 6,236,391 | B1 | 5/2001 | Kent et al. |
| 6,288,707 | B1 | 9/2001 | Philipp |
| 6,297,811 | B1 | 10/2001 | Kent et al. |
| 6,373,474 | B1 | 4/2002 | Katabami |
| 6,379,509 | B2 | 4/2002 | Choi et al. |
| 6,380,929 | B1 | 4/2002 | Platt |
| 6,380,931 | B1 | 4/2002 | Gillespie et al. |
| 6,414,671 | B1 | 7/2002 | Gillespie et al. |
| 6,441,809 | B2 | 8/2002 | Kent et al. |
| 6,452,514 | B1 | 9/2002 | Philipp |
| 6,466,036 | B1 | 10/2002 | Philipp |
| 6,488,981 | B1 | 12/2002 | Richter et al. |
| 6,492,979 | B1 | 12/2002 | Kent et al. |
| 6,504,530 | B1 | 1/2003 | Wilson et al. |
| 6,504,583 | B2 | 1/2003 | Li et al. |
| 6,506,983 | B1 | 1/2003 | Babb et al. |
| 6,535,200 | B2 | 3/2003 | Philipp |
| 6,549,193 | B1 | 4/2003 | Huang et al. |
| 6,555,235 | B1 | 4/2003 | Aufderheide et al. |
| 6,587,097 | B1 | 7/2003 | Aufderheide et al. |
| 6,723,929 | B2 | 4/2004 | Kent |
| 6,738,051 | B2 | 5/2004 | Boyd et al. |
| 6,750,852 | B2 | 6/2004 | Gillespie et al. |
| 6,781,579 | B2 | 8/2004 | Huang et al. |
| 6,784,873 | B1 | 8/2004 | Boesen et al. |
| 6,809,280 | B2 | 10/2004 | Divigalpitiya et al. |
| 6,819,316 | B2 | 11/2004 | Schulz et al. |
| 6,825,833 | B2 | 11/2004 | Mulligan et al. |
| 6,842,171 | B2 | 1/2005 | Richter et al. |
| 6,856,259 | B1 | 2/2005 | Sharp |
| 6,904,570 | B2 | 6/2005 | Foote et al. |
| 6,927,761 | B2 | 8/2005 | Badaye et al. |
| 6,943,705 | B1 | 9/2005 | Bolender et al. |
| 6,961,049 | B2 | 11/2005 | Mulligan et al. |
| 6,970,160 | B2 | 11/2005 | Mulligan et al. |
| 6,977,646 | B1 | 12/2005 | Hauck et al. |
| 6,993,607 | B2 | 1/2006 | Philipp |
| 7,000,474 | B2 | 2/2006 | Kent |
| 7,006,081 | B2 | 2/2006 | Kent et al. |
| 7,030,860 | B1 | 4/2006 | Hsu et al. |
| 7,061,475 | B2 | 6/2006 | Kent |
| 7,102,621 | B2 | 9/2006 | Roberts |
| 7,109,976 | B2 | 9/2006 | Cobian |
| 7,109,978 | B2 | 9/2006 | Gillespie et al. |
| 7,129,935 | B2 | 10/2006 | Mackey |
| 7,148,704 | B2 | 12/2006 | Philipp |
| 7,148,882 | B2 | 12/2006 | Kamrath et al. |
| 7,151,532 | B2 | 12/2006 | Schulz |
| 7,154,481 | B2 | 12/2006 | Cross et al. |
| 7,158,122 | B2 | 1/2007 | Roberts |
| 7,176,897 | B2 | 2/2007 | Roberts |
| 7,176,902 | B2 | 2/2007 | Peterson, Jr. et al. |
| 7,183,948 | B2 | 2/2007 | Roberts |
| 7,190,350 | B2 | 3/2007 | Roberts |
| 7,190,352 | B2 | 3/2007 | Ling et al. |
| 7,196,694 | B2 | 3/2007 | Roberts |
| 7,202,859 | B1 | 4/2007 | Speck et al. |
| 7,212,189 | B2 | 5/2007 | Shaw et al |
| 7,227,538 | B2 | 6/2007 | Geaghan et al. |
| 7,236,161 | B2 | 6/2007 | Geaghan et al. |
| 7,253,643 | B1 | 8/2007 | Seguine |
| 7,253,809 | B2 | 8/2007 | Boyd et al. |
| 7,254,775 | B2 | 8/2007 | Geaghan et al. |
| 7,256,714 | B2 | 8/2007 | Philipp |
| 7,277,087 | B2 | 10/2007 | Hill et al. |
| 7,279,647 | B2 | 10/2007 | Philipp |
| 7,295,190 | B2 | 11/2007 | Philipp |
| 7,298,367 | B2 | 11/2007 | Geaghan et al. |
| 7,303,809 | B2 | 12/2007 | Choi et al. |
| 7,307,624 | B2 | 12/2007 | Geaghan et al. |
| 7,315,300 | B2 | 1/2008 | Hill et al. |
| 7,327,352 | B2 | 2/2008 | Keefer et al. |
| 7,339,579 | B2 | 3/2008 | Richter et al. |
| 7,515,140 | B2 | 4/2009 | Philipp |
| 7,821,425 | B2 | 10/2010 | Philipp |
| 7,821,502 | B2 | 10/2010 | Hristov |
| 7,825,905 | B2 | 11/2010 | Philipp |
| 7,903,092 | B2 | 3/2011 | Philipp |
| 7,932,898 | B2 | 4/2011 | Philipp et al. |
| 7,945,297 | B2 | 5/2011 | Philipp |
| 7,969,330 | B2 | 6/2011 | Philipp |
| 2001/0026330 | A1 | 10/2001 | Oh |
| 2002/0030666 | A1 | 3/2002 | Philipp |
| 2002/0145593 | A1 | 10/2002 | Boyd et al. |
| 2002/0191029 | A1 | 12/2002 | Gillespie et al. |
| 2003/0001826 | A1 | 1/2003 | Richter et al. |
| 2003/0095111 | A1 | 5/2003 | Song et al. |
| 2003/0103043 | A1 | 6/2003 | Mulligan et al. |
| 2003/0132922 | A1 | 7/2003 | Philipp |
| 2003/0137498 | A1 | 7/2003 | Huang et al. |
| 2003/0184523 | A1 | 10/2003 | Badaye et al. |
| 2003/0205450 | A1 | 11/2003 | Divigalpitiya et al. |
| 2004/0008129 | A1 | 1/2004 | Philipp |
| 2004/0061687 | A1 | 4/2004 | Kent et al. |
| 2004/0100448 | A1 | 5/2004 | Moshrefzadeh |
| 2004/0104826 | A1 | 6/2004 | Philipp |
| 2004/0135773 | A1 | 7/2004 | Bang et al. |
| 2004/0178997 | A1 | 9/2004 | Gillespie et al. |
| 2004/0188150 | A1 | 9/2004 | Richard et al. |
| 2004/0189882 | A1 | 9/2004 | Jeong et al. |
| 2004/0252109 | A1 | 12/2004 | Trent, Jr. et al. |
| 2005/0024341 | A1 | 2/2005 | Gillespie et al. |
| 2005/0035953 | A1 | 2/2005 | Woolley et al. |
| 2005/0041018 | A1 | 2/2005 | Philipp |
| 2005/0052429 | A1 | 3/2005 | Philipp |
| 2005/0078027 | A1 | 4/2005 | Philipp |
| 2005/0110766 | A1 | 5/2005 | Kent et al. |
| 2005/0110767 | A1 | 5/2005 | Gomes et al. |
| 2005/0162408 | A1 | 7/2005 | Martchovsky |
| 2005/0174335 | A1 | 8/2005 | Kent et al. |
| 2005/0179673 | A1 | 8/2005 | Philipp |
| 2005/0246459 | A1 | 11/2005 | Philipp |
| 2005/0260338 | A1 | 11/2005 | Chien |
| 2006/0038793 | A1 | 2/2006 | Philipp |
| 2006/0092142 | A1 | 5/2006 | Gillespie et al. |
| 2006/0097991 | A1 | 5/2006 | Hotelling et al. |
| 2006/0132453 | A1 | 6/2006 | Boyd et al. |
| 2006/0132462 | A1 | 6/2006 | Geaghan |
| 2006/0139340 | A1 | 6/2006 | Geaghan |
| 2006/0187214 | A1 | 8/2006 | Gillespie et al. |
| 2006/0187216 | A1 | 8/2006 | Trent, Jr. et al. |
| 2006/0192690 | A1 | 8/2006 | Philipp |
| 2006/0202969 | A1 | 9/2006 | Hauck |
| 2006/0202970 | A1 | 9/2006 | Lii et al. |
| 2006/0207806 | A1 | 9/2006 | Philipp |
| 2006/0223346 | A1 * | 10/2006 | Fujii et al. ............... 439/76.2 |
| 2006/0238513 | A1 | 10/2006 | Philipp |
| 2006/0274047 | A1 | 12/2006 | Spath et al. |
| 2006/0274055 | A1 | 12/2006 | Reynolds et al. |
| 2006/0279548 | A1 | 12/2006 | Geaghan |
| 2006/0284836 | A1 | 12/2006 | Philipp |
| 2007/0002192 | A1 | 1/2007 | Nishino et al. |
| 2007/0008299 | A1 | 1/2007 | Hristov |

(56) References Cited

U.S. PATENT DOCUMENTS

| | | |
|---|---|---|
| 2007/0013671 A1 | 1/2007 | Zadesky et al. |
| 2007/0026089 A1 | 2/2007 | Hu |
| 2007/0052690 A1 | 3/2007 | Roberts |
| 2007/0062739 A1 | 3/2007 | Philipp et al. |
| 2007/0074914 A1 | 4/2007 | Geaghan et al. |
| 2007/0085838 A1 | 4/2007 | Ricks et al. |
| 2007/0091076 A1 | 4/2007 | Schulz |
| 2007/0103446 A1 | 5/2007 | Chien et al. |
| 2007/0109274 A1 | 5/2007 | Reynolds |
| 2007/0159561 A1 | 7/2007 | Chien |
| 2007/0176906 A1 | 8/2007 | Warren |
| 2007/0188476 A1 | 8/2007 | Bayramoglu et al. |
| 2007/0222766 A1 | 9/2007 | Bolender |
| 2007/0229466 A1 | 10/2007 | Peng et al. |
| 2007/0229468 A1 | 10/2007 | Peng et al. |
| 2007/0229470 A1 | 10/2007 | Snyder et al. |
| 2007/0236475 A1 | 10/2007 | Wherry |
| 2007/0236478 A1 | 10/2007 | Geaghan et al. |
| 2007/0236618 A1 | 10/2007 | Maag et al. |
| 2007/0247443 A1 | 10/2007 | Philipp |
| 2007/0257893 A1 | 11/2007 | Philipp et al. |
| 2007/0257894 A1 | 11/2007 | Philipp |
| 2007/0262962 A1 | 11/2007 | XiaoPing et al. |
| 2007/0262963 A1 | 11/2007 | Xiao-Ping et al. |
| 2007/0264844 A1 | 11/2007 | Hu |
| 2007/0268265 A1 | 11/2007 | XiaoPing |
| 2007/0268266 A1 | 11/2007 | XiaoPing |
| 2007/0268276 A1 | 11/2007 | Kent et al. |
| 2007/0273560 A1 | 11/2007 | Hua et al. |
| 2007/0273561 A1 | 11/2007 | Philipp |
| 2007/0279395 A1 | 12/2007 | Philipp et al. |
| 2007/0291009 A1 | 12/2007 | Wright et al. |
| 2007/0291016 A1 | 12/2007 | Philipp |
| 2007/0296709 A1 | 12/2007 | GuangHai |
| 2008/0001925 A1 | 1/2008 | XiaoPing |
| 2008/0007434 A1 | 1/2008 | Hristov |
| 2008/0007534 A1* | 1/2008 | Peng et al. .................... 345/173 |
| 2008/0012832 A1 | 1/2008 | GuangHai |
| 2008/0018618 A1 | 1/2008 | Hill et al. |
| 2008/0024461 A1 | 1/2008 | Richter et al. |
| 2008/0029292 A1 | 2/2008 | Takayama et al. |
| 2008/0041641 A1 | 2/2008 | Geaghan et al. |
| 2008/0042994 A1 | 2/2008 | Gillespie et al. |
| 2008/0048978 A1 | 2/2008 | Trent, Jr. et al. |
| 2008/0048997 A1 | 2/2008 | Gillespie et al. |
| 2008/0062139 A1 | 3/2008 | Hotelling et al. |
| 2008/0074398 A1 | 3/2008 | Wright |
| 2008/0111714 A1 | 5/2008 | Kremin |
| 2008/0122802 A1 | 5/2008 | Furuhashi et al. |
| 2008/0138589 A1 | 6/2008 | Wakabayashi et al. |
| 2008/0142352 A1 | 6/2008 | Wright |
| 2008/0143683 A1* | 6/2008 | Hotelling .................... 345/173 |
| 2008/0150905 A1 | 6/2008 | Grivna et al. |
| 2008/0150906 A1 | 6/2008 | Grivna |
| 2008/0158181 A1 | 7/2008 | Hamblin et al. |
| 2008/0158183 A1 | 7/2008 | Hotelling et al. |
| 2008/0165139 A1 | 7/2008 | Hotelling et al. |
| 2008/0165158 A1 | 7/2008 | Hotelling et al. |
| 2008/0264699 A1 | 10/2008 | Chang et al. |
| 2008/0309635 A1 | 12/2008 | Matsuo |
| 2009/0008160 A1 | 1/2009 | Aroyan et al. |
| 2009/0085891 A1 | 4/2009 | Yang et al. |
| 2009/0135151 A1 | 5/2009 | Sun |
| 2009/0160817 A1 | 6/2009 | Wu et al. |
| 2009/0160824 A1 | 6/2009 | Chih-Yung et al. |
| 2009/0167710 A1 | 7/2009 | Jiang et al. |
| 2009/0194344 A1 | 8/2009 | Harley et al. |
| 2009/0236151 A1 | 9/2009 | Yeh et al. |
| 2009/0309850 A1 | 12/2009 | Yang |
| 2010/0024573 A1 | 2/2010 | Daverman et al. |
| 2010/0026655 A1 | 2/2010 | Harley |
| 2010/0045625 A1 | 2/2010 | Yang et al. |
| 2010/0066700 A1 | 3/2010 | Mozdzyn |
| 2010/0073319 A1 | 3/2010 | Lyon et al. |
| 2010/0078230 A1 | 4/2010 | Rosenblatt et al. |
| 2010/0085326 A1 | 4/2010 | Anno |
| 2010/0271330 A1 | 10/2010 | Philipp |
| 2010/0309145 A1 | 12/2010 | Chiang et al. |
| 2011/0012845 A1 | 1/2011 | Rothkopf et al. |
| 2011/0157085 A1 | 6/2011 | Philipp |

FOREIGN PATENT DOCUMENTS

| | | |
|---|---|---|
| JP | 2004280720 A | 10/2004 |
| KR | 200229845 Y1 | 7/2001 |
| KR | 10-2005-0100274 A | 10/2005 |
| KR | 10-2007-0081902 A | 8/2007 |
| KR | 100907512 B1 | 7/2009 |

OTHER PUBLICATIONS

Adler, R., et al., An Economical Touch Panel using SAW Absorption, IEEE Transactions on Ultrasonics, Ferroelectrics and Frequency Control, Mar. 1987, vol. 34, No. 2, pp. 195-201.

Touchscreenguide.com (http://www.touchscreenguide.com/touchscreen/res.html), as printed from the Internet on Oct. 28, 2011, 1 pg.

\* cited by examiner

CAPACITIVE TOUCH PANEL WITH FPC CONNECTOR ELECTRICALLY COUPLED TO CONDUCTIVE TRACES OF FACE-TO-FACE ITO PATTERN STRUCTURE IN SINGLE PLANE

CROSS REFERENCE TO RELATED APPLICATIONS

This application claims priority under 35 U.S.C. 119 to U.S. Provisional Application No. 61/084,877 entitled "Glass Substrate for Capacitive Touch Panel and Manufacturing Method Thereof" filed on Jul. 30, 2008, and U.S. Provisional Application No. 61/087,015 entitled "Glass Substrate for Capacitive Touch Panel and Manufacturing Method Thereof" filed on Aug. 7, 2008 the contents of which are incorporated by reference herein.

BACKGROUND

Many devices use touch screens as a convenient and intuitive way for users to both view and enter information. Common applications include mobile phones, PDAs, ATMs, GPS navigation systems, electronic games, and computer interfaces, to name just a few examples. Touch screens allow a user to interact with a device by using a finger or stylus to touch objects displayed on a screen, such as icons, text, buttons, etc. In some applications, a user may also "write" directly on a touch screen, such as in a PDA or other device that implements character recognition.

There are numerous technologies used to implement touch screens, including technologies that use the electrical property of capacitance to detect user inputs. A capacitive touch screen sensor is one type of sensor that generally operates by capacitive coupling of current through a transparent dielectric layer to a user's finger (or stylus). This type of sensor typically includes a capacitive sensing circuit with multiple transparent electrodes, each producing an electric field across a touch sensitive area of the sensor. The capacitive sensing circuit may be adjacent to a transparent sensor substrate (e.g., glass). A touch near one or more electrodes of the sensing circuit may affect the electric field and create a signal that can be detected. A set of electrical connections may be made between the sensing circuit and detection electronics (e.g., a controller) that resolves the signals to determine the location of the touch on the sensor. The coordinates of the location may then be communicated to another processor such as a host computer for further processing.

In a typical capacitive sensor, a stack that comprises a plurality of transparent layers is utilized, including substrate layers (e.g., glass), transparent conductive layers (e.g., indium tin oxide (ITO)) adjacent to the substrates, and possibly a layer acting as a shield on the bottom of the stack. Metal traces and flexible printed circuit (FPC) connectors may be used to couple the conductive layers to the detection electronics (e.g., a controller).

FIGS. 1A-1B illustrate one type of prior art capacitive touch panel 10 that includes top and bottom glass substrates 12, 14 that are each coated with ITO layers 16, 18, respectively. The ITO layers 16, 18 each include a pattern of electrodes positioned across a surface of the top and bottom glass substrates 12, 14. As shown, the top and bottom glass substrates 12, 14 are arranged in a face-to-face ITO pattern structure, such that the surfaces of the top and bottom glass substrates 12, 14 coated with the ITO layers 16, 18 are facing each other. The top and bottom glass substrates 12, 14 may be bonded together by an optically clear adhesive (OCA) 20, such as an OCA sold by 3M Electronics.

The pattern of electrodes in both the top and bottom ITO layers 16, 18 may be coupled to metal traces 22, 24 to connect the ITO electrodes to touch detection electronics such as a controller. For instance, the metal traces 22, 24 may be positioned at opposite edges of the top and bottom glass substrates 12, 14 with portions thereof in contact with the ITO layers 16, 18. Two flexible printed circuit (FPC) connectors 26, 28 may then be connected to the metal traces 22, 24 by a bonding process for instance. The FPC connectors 26, 28 are discussed in further detail below in reference to FIG. 4.

FIG. 1B is similar to FIG. 1A but additionally illustrates a hot bar 30 that may be used in a process for bonding the FPC connector 28 to the metal traces 24 associated with the bottom substrate 14. As shown, the hot bar 30 may be pressed onto the surface of the FPC connector 28 to urge the FPC connector 28 against the metal traces 24 for a predetermined period of time (e.g., several seconds). To perform this bonding process, there must be sufficient clearance above the metal traces 24 to place the hot bar 30, as well as a pressing mechanism (not shown). As can be appreciated, the metal traces 22 positioned on the lower surface of the top substrate 12 may be on a side of the panel 10 different from the metal traces 24, so that there will be sufficient clearance for the hot bar 30 and pressing mechanism to secure the FPC connector 26 to the top ITO layer 16 via the top metal traces 22. However, the use of two FPC connectors 26, 28 increases cost and the complexity of the manufacturing design and process.

To eliminate the need for two separate FPC connectors, the prior art touch panel 40 illustrated in FIG. 2 may be used. Similar to the panel 10 shown in FIG. 1, the panel 40 includes top and bottom glass substrates 42, 44 coated with respective top and bottom ITO layers 46, 48 and adhered to each other by an OCA 50. In this touch panel however, the bottom ITO layer 48 is coated onto the lower surface of the bottom substrate 44, rather than the upper surface as shown in FIG. 1, such that the ITO pattern structure is in a "face-to-back" configuration. This design has the advantage of permitting a single bifurcated FPC connector 56 (a top view of FPC connector 56 is shown in FIG. 3) to be used, instead of two FPC connectors positioned on different sides of the touch panel, as in the panel 10 shown in FIG. 1. While the single FPC connector 56 may be used because there is sufficient clearance above the metal traces 52, 54 for the bonding process, this design also possesses significant disadvantages. For example, the design for the FPC connector 56 is complex because it must be operable to connect to metal traces 52, 54 in two different planes. Further, the FPC connector bonding process for the panel 40 may be complicated because two separate hot bar assemblies (e.g., each being similar to the hot bar 30 shown in FIG. 1B) are required to bond the bifurcated FPC connector to the metal traces 52, 54. Further, due to the face-to-back configuration, the bottom ITO layer 48 is significantly further away from a user's touch (e.g., using a finger or stylus) than the top ITO layer 46. This difference results in reduced signal strength from the electrodes on the bottom ITO layer 48, which in turn reduces the performance of the touch panel. Stated otherwise, increasing the distance between the top and bottom ITO layers 46, 48 reduces the capacitance of the touch panel. To compensate for the lower signal strength, an ITO layer that has a relatively low resistance may be used, but this has the negative effect of increasing the visibility of the ITO layer, thereby reducing the contrast of the display device.

FIG. 3 illustrates a top view of the bifurcated FPC connector 56 also shown in FIG. 2. When positioned in a touch panel, a first set of conductive pads 58 may be coupled to the metal traces 52 associated with the top ITO pattern 46, and another set of pads 60 may be connected to the metal traces 54 associated with the bottom ITO pattern 48. As can be appreciated, the other end of the connector 56 may include a plurality of pads 62 that may be coupled to touch detection electronics such as a controller.

FIG. 4 illustrates a top view of the normal (e.g., not bifurcated) FPC connector 26 that is also shown in FIGS. 1A-1B. As shown, the construction is relatively simple and includes conductive pads 27 that may be coupled to the metal traces 22 of the top ITO pattern 16 and a pad of connectors 29 that may be coupled touch detection electronics. Although the design and construction of the FPC connector 26 is relatively simple, the need for two FPC connectors on different sides of the touch panel 10 is costly, increases complexity of manufacturing, and increases the surface area required for the touch panel.

SUMMARY

Disclosed herein is a capacitive touch screen panel including a first transparent substrate that includes a first conductive layer disposed adjacent to a surface thereof, a second transparent substrate that includes a second conductive layer disposed adjacent to a surface thereof, and a transparent material disposed between the first and second transparent substrates such that the first and second conductive layers are arranged in a face-to-face relationship. A first set of conductive traces is disposed on the first transparent substrate such that at least one trace of the first set of conductive traces is coupled to the first conductive layer, and a second set of conductive traces is disposed on the second transparent substrate such that at least one trace of the second set of conductive traces is coupled to the second conductive layer and at least another trace of the second set of conductive traces is not coupled to the second conductive layer. An electrically conductive adhesive is disposed between the at least one trace of the first set of conductive traces and the at least another trace of the second set of conductive traces, and a flexible printed circuit connector is coupled to each of the at least one trace of the second set of conductive traces and the at least another trace of the second set of conductive traces.

The at least another trace of the first set of conductive traces may not coupled to the first conductive layer. The face-to-face relationship of the first and second conductive layers may be operable to align the at least one trace of the first set of conductive traces with the at least another trace of the second set of conductive traces, and the at least another trace of the first set of conductive traces with the at least one trace of the second set of conductive traces. The electrically conductive adhesive may be disposed between the at least one trace of the first set of conductive traces and the at least another trace of the second set of conductive traces, and the at least another trace of the first set of conductive traces and the at least one trace of the second set of conductive traces.

The electrically conductive adhesive may include a seal frit that extends around a substantial portion of each of the first and second transparent substrates. The flexible printed circuit connector may includes a plurality of pads, a first pad of the plurality of pads being coupled to the at least one trace of the second set of conductive traces, and a second pad of the plurality of pads being coupled to the at least another trace of the second set of conductive traces.

Each of the first and second conductive layers may include at least one row of electrodes. Each of the electrodes in the at least one row of electrodes in each of the first and second conductive layers may be diamond-shaped. The at least one row of electrodes of the first conductive layer may be generally perpendicular to the at least one row of electrodes of the second conductive layer.

A first portion of the flexible printed circuit connector may be coupled to each of the at least one trace of the second set of conductive traces and the at least another trace of the second set of conductive traces, the first portion of the flexible printed circuit connector generally residing in a single plane. The electrically conductive adhesive may include a mixture of epoxy resin and Au balls. At least one Au ball may be disposed between the at least one trace of the first set of conductive traces and the at least another trace of the second set of conductive traces.

The electrically conductive adhesive may include a liquid crystal. The first and second conductive layers may include indium tin oxide (ITO). A plurality of spacers may be disposed between the first and second transparent substrates, and the spacers may include glass or plastic balls.

Also disclosed herein is a capacitive touch screen panel including a first transparent substrate that includes a first conductive layer disposed adjacent to a surface thereof, a second transparent substrate that includes a second conductive layer disposed adjacent to a surface thereof, a transparent material disposed between the first and second transparent substrates such that the first and second conductive layers are arranged in a face-to-face relationship, and a plurality of spacers disposed between the first and second transparent substrates. The first transparent substrate, second transparent substrate, and transparent material have approximately the same refractive index. The transparent material may include optical glue.

Additionally disclosed herein is a capacitive touch screen panel including a first transparent substrate that includes a first conductive layer disposed adjacent to a surface thereof, a second transparent substrate that includes a second conductive layer disposed adjacent to a surface thereof, a transparent material disposed between the first and second transparent substrates such that the first and second conductive layers are arranged in a face-to-face relationship, a first set of conductive traces disposed on the first transparent substrate, a second set of conductive traces disposed on the second transparent substrate, and a flexible printed circuit connector having a first portion that is coupled to at least some of the conductive traces of the first set of conductive traces and at least some of the conductive traces of the second set of conductive traces. The first portion of the flexible printed circuit connector generally resides in a single plane.

Also disclosed herein is a method for forming a capacitive touch screen including providing top and bottom glass sheets, each of the top and bottom glass sheets including a surface having a conductive pattern and a number of conductive traces, laminating an optically clear adhesive onto the surface having a conductive pattern of one of the top and bottom glass sheets, printing seal glue mixed with Au balls onto the number of conductive traces of the other of the top and bottom glass sheets, assembling the top and bottom glass sheets together such that each of the surfaces having a conductive pattern of each of the top and bottom sheets face each other, scribing the top and bottom glass sheets to form a number of individual units, curing the seal glue mixed with Au balls of at least one of the individual units, and bonding a flexible printed circuit connector to the number of conductive traces of one of the top and bottom glass sheets.

The method may include aligning each metal trace of the number of metal traces of the top glass sheet with a respective metal trace of the number of metal traces of the bottom glass sheet. After the scribing step, the method may include performing an autoclave process on each of the individual units. The autoclave process may be performed at about 150 degrees Celsius and at about 18 psi.

DETAILED DESCRIPTION

Figure 1A:
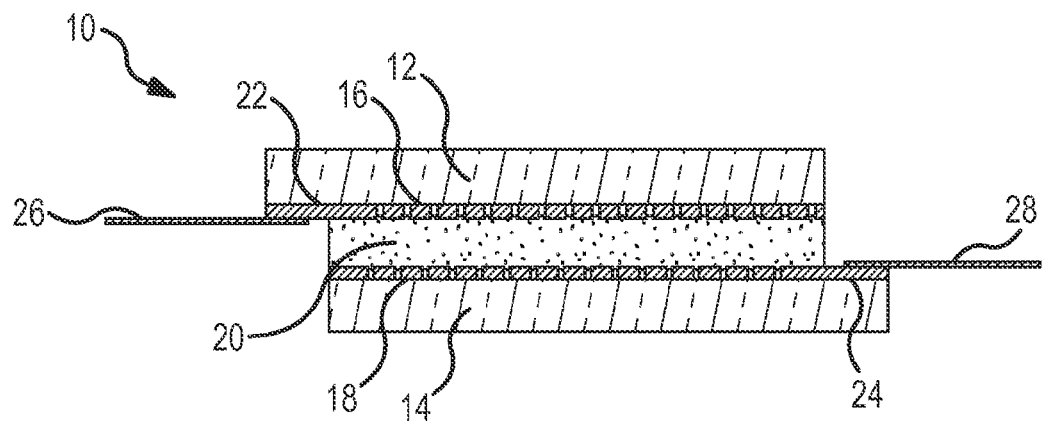
FIGS. 1A-1B illustrate a prior art touch panel assembly.

While the embodiments are susceptible to various modifications and alternative forms, specific embodiments thereof have been shown by way of example in the drawings and are herein described in detail. It should be understood, however, that the embodiments are not intended to be limited to the particular form disclosed, but rather, the embodiments are intended to cover all modifications, equivalents, and alternatives falling within the scope and spirit of the embodiments as defined by the claims.

Figure 5:
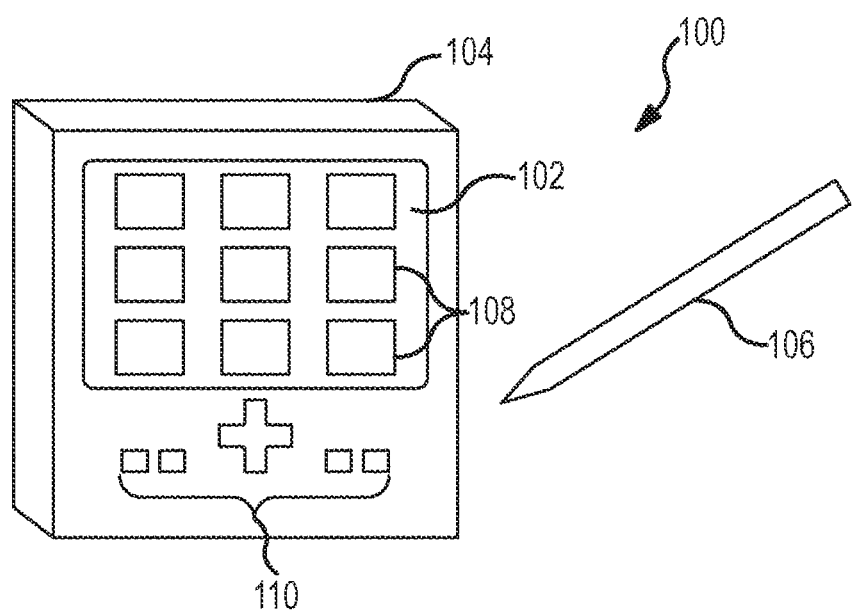
FIG. 5 illustrates an embodiment of a display device that incorporates a touch screen panel assembly.

FIG. 5 illustrates a device 100 having an integrated touch screen display 102. The device 100 may also include a housing 104 and a number of buttons 110. The device 100 may be, by way of example and not of limitation, a cell phone, game system, PDA, media player, or any other device that includes a touch screen display. In this regard, specific features of the device 100 may vary. One or more objects 108 may be displayed on the integrated touch screen display 102. The objects 108 may include, without limitation, graphics, icons, text, buttons, images, etc. A user may interact with the device 100 by touching the touch screen display 102 where one or more objects 108 appear, for example with a stylus 106 or a finger (not shown).

Figure 6A:
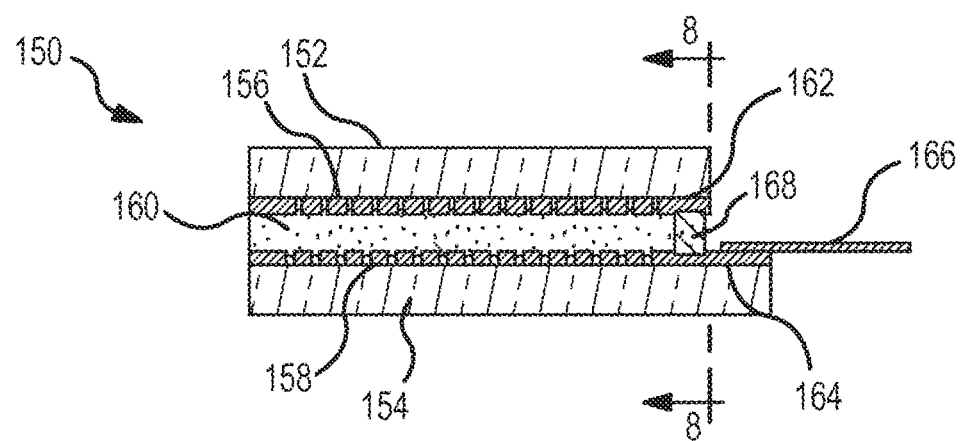
FIG. 6A illustrates one embodiment of a touch panel assembly.

FIG. 6A illustrates an exemplary touch panel 150 that may be used in a display device, such as the display device 100 illustrated in FIG. 5. The panel 150 may include a top glass substrate 152 coated with a top ITO pattern 156 on a lower surface (not labeled). The panel 150 also may include a bottom glass substrate 154 coated with a bottom ITO pattern 158 on an upper surface (not labeled). The top and bottom glass substrates 152, 154 may be disposed in a parallel arrangement and adhered together by a bonding agent which may be in the form of a transparent material such as an optically clear adhesive 160 (OCA). In some embodiments, the OCA may be in direct contact with the top and bottom ITO coated patterns 156, 158. In other embodiments, the OCA may not be in direct contact with top and bottom ITO coated patterns 156, 158. For instance, another appropriate layer of material (e.g., an alignment layer, not shown) may first be disposed over each of the top and bottom ITO coated patterns 156, 158 such that the OCA may be in direct contact with the alignment layer instead of the top and bottom ITO coated patterns 156, 158. In any case, the top and bottom ITO patterns 156, 158 may be positioned in a face-to-face relationship, which, as described above, reduces or eliminates the need for low resistive ITO layers that may be required when the ITO pattern structure is in a face-to-back arrangement as illustrated in the prior art touch screen assembly of FIG. 2.

Figure 6B:
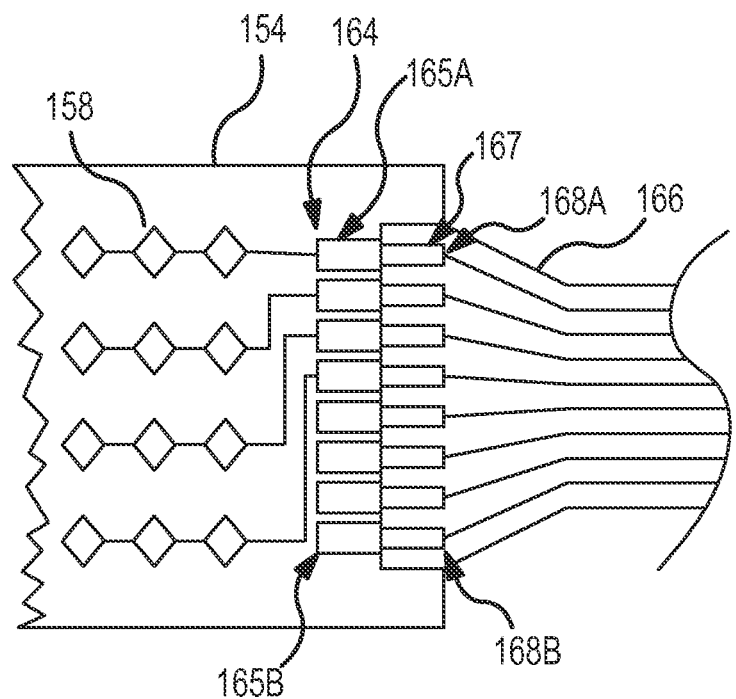
FIG. 6B illustrates a top view of a bottom glass substrate and an FPC connector of the touch panel assembly of FIG. 6A.
Figure 6C:
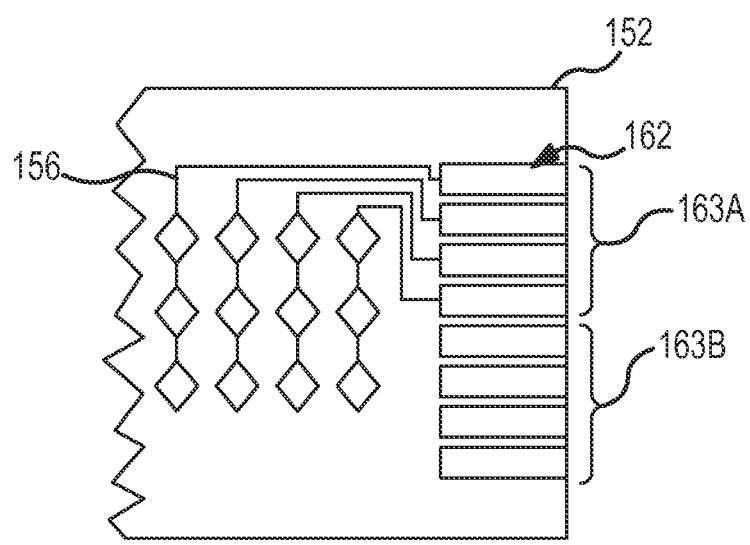
FIG. 6C illustrates a top view of a top glass substrate of the touch panel assembly of FIG. 6A before being assembled with the bottom glass substrate of FIG. 6B.

With reference to FIGS. 6A-6C, the bottom ITO pattern 158 on the bottom glass substrate 154 may include four rows of electrodes (not labeled). The bottom glass substrate 154 also includes a number of metal traces 164. As shown, the bottom glass substrate 154 may include a first set of metal traces 165a (e.g., four metal traces), each of which may be appropriately electrically coupled to a respective row of electrodes. The bottom glass substrate 154 may also include a second set of metal traces 165b that are not coupled to any rows of electrodes on the bottom glass substrate 154 for reasons that will be described below. Similarly, the top ITO pattern 156 may have four rows of electrodes (not labeled) and a number of metal traces 162. The top glass substrate 152 may have a first set of metal traces 163a each of which is respectively electrically coupled to a row of electrodes on the top glass substrate 152 and a second set of metal traces 163b each of which is not electrically coupled to a row of electrodes of the top glass substrate 152. Although each of the top and bottom glass substrates 152, 154 has been described as having four rows of electrodes, it is envisioned that other appropriate numbers of rows of electrodes may be used. Furthermore, while each of the top and bottom glass substrates 152, 154 has been described as including at least one metal trace electrically connected to one row of electrodes in addition to metal traces that are not electrically connected to any rows of electrodes, it is contemplated that one of the top or bottom substrates 152, 154 (e.g., the substrate not directly electrically connected to an FPC connector) may have only traces that are electrically connected to rows of electrodes. Moreover, the metal traces 162, 164 may be of any appropriate design and shape.

In this embodiment, a single, normal (e.g., not bifurcated) FPC connector 166 may be used to couple both the top and bottom ITO patterns 156, 158 to detection electronics. For instance, an electrically conductive adhesive 168 may couple the metal traces 162 associated with the top ITO pattern 156 of the top glass substrate 152 to the metal traces 164 associated with the bottom ITO pattern 158 of the bottom glass substrate 154. Also, the metal traces 164 associated with the bottom ITO pattern 158 may be electrically bonded to the FPC connector 166 by any appropriate material (e.g., anistropic conductive film), although it is envisioned that the metal traces 162 associated with the top ITO pattern 156 could be bonded to the FPC connector 166. The electrically conductive adhesive 168 may be seal glue (e.g., epoxy resin) mixed with a relatively small amount of metallic balls (e.g., about 2-4% Au balls). Further, the size of each Au ball may be larger (e.g., 5 um larger) than the thickness of the layer of the OCA 160 to provide a reliable connection between the metal traces 162 and 164. Those skilled in the art will readily recognize that other electrically conductive adhesives may be used that are operable to couple the metal traces of two different layers together. Moreover, each of the metal traces 162, 164 may be constructed from any suitable material. For example, in one embodiment at least one of the metal traces may include a composite metal layer that includes two layers of molybdenum with a layer of aluminum disposed therebetween (e.g., Mo/Al/Mo composite metal layers).

To better illustrate this embodiment, FIG. 6B shows a top view of the bottom glass substrate 154 and the FPC connector 166, and FIG. 6C shows a top view of the top glass substrate 152 before being assembled with the bottom glass substrate of FIG. 6B. In this example, the FPC connector 166 may include any appropriate number of pads 167 (e.g., eight pads) each of which may be appropriately electrically bonded to each of the metal traces 164 of the bottom glass substrate 154, e.g., each metal trace of the first and second sets of metal traces 165a, 165b. For example, the FPC connector 166 may include first and second sets of pads 168a, 168b. As shown and as previously described, each metal trace of the first set of metal traces 165a (e.g., four metal traces) may be respectively appropriately electrically coupled to a row of electrodes of the bottom ITO pattern 158 disposed on the bottom glass substrate 154, to a pad of the first set of pads 168a of the FPC connector 166, and to a metal trace 162 of the top glass substrate 152 (e.g., the second set of metal traces 163b not connected to electrode rows) by way of any appropriate adhesive or other bonding substance (e.g., electrically conductive adhesive, anisotropic conductive films). Each metal trace of the second set of metal traces 165b (e.g., four metal traces), none of which is electrically connected to a row of electrodes on the bottom glass substrate 154, may be appropriately coupled to a pad of the second set of pads 168b of the FPC connector 166 and to one of the metal traces 162 associated with the top ITO pattern 156 that is electrically coupled to a respective row of electrodes on the top glass substrate 152 (e.g., from the first set of metal traces 163a of the top glass substrate 152).

As previously discussed, the ITO layer 156 of the top glass substrate 152 may include four rows of electrodes (not labeled) and first and second sets of metal traces 163a, 163b. Each metal trace of the first set of metal traces 163a of the top glass substrate 152 may be respectively electrically coupled to a row of electrodes on the top glass substrate 152 and each metal trace of the second set of metal traces 163b of the top glass substrate 152 may not be electrically coupled to any rows of electrodes on the top glass substrate 152. However, other numbers and arrangements of electrodes and metal traces are envisioned and are encompassed within the scope of the embodiments. As shown, each of the electrodes of the top and bottom ITO layers 156, 158 may include a diamond shape and may be of any appropriate size. In one arrangement, one or more of the electrodes may be between 3 and 9 mm in width and in another arrangement, between 5 and 7 mm in width.

As will be more fully described in the method of FIG. 7 described below, the single FPC connector 166 may be electrically connected to both the top ITO pattern 156 and to the bottom ITO pattern 158 in at least a generally single plane with the top and bottom ITO patterns 156, 158 in a face to face relationship. For instance, a conductive adhesive 168 (e.g., epoxy resin mixed with Au balls) as shown in FIG. 6A may be applied to all of the metal traces 162, 164 of the top and/or bottom glass substrates 152, 154. The top and bottom glass substrates 152, 154 may then be arranged in a face to face relationship such that the metal traces 162 of the top glass substrate 152 that are electrically connected to rows of electrodes on the top glass substrate 152 (e.g., the first set of traces 163a) are aligned only with metal traces 164 of the bottom glass substrate 154 that are not electrically connected to any rows of the electrodes on the bottom glass substrate 154 (e.g., the second set of traces 165b). Also, the metal traces 162 of the top glass substrate 152 that are not electrically connected to any rows of electrodes on the top glass substrate 152 (e.g., the second set of metal traces 163b) are aligned only with metal traces 164 of the bottom glass substrate 154 that are electrically connected to rows of the electrodes on the bottom glass substrate 154 (e.g., first set of metal traces 165a). Due to the presence of the Au balls in the electrically conductive adhesive 168 and as illustrated in FIG. 8, at least one Au ball may be present between respective aligned metal traces 162, 164 of the top and bottom glass substrates 152, 154 to electrically connect such respective metal traces as will be described in more detail below.

Figure 1B:
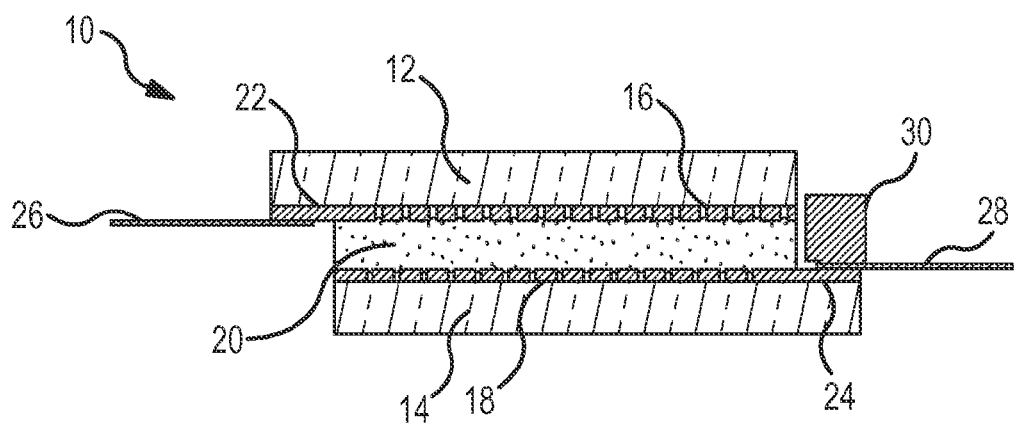
Figure 2:
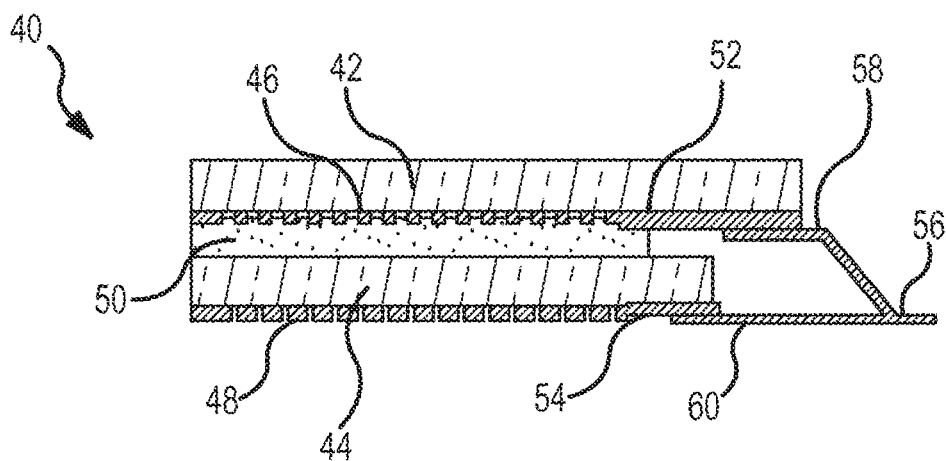
FIG. 2 illustrates another prior art touch panel assembly.
Figure 3:
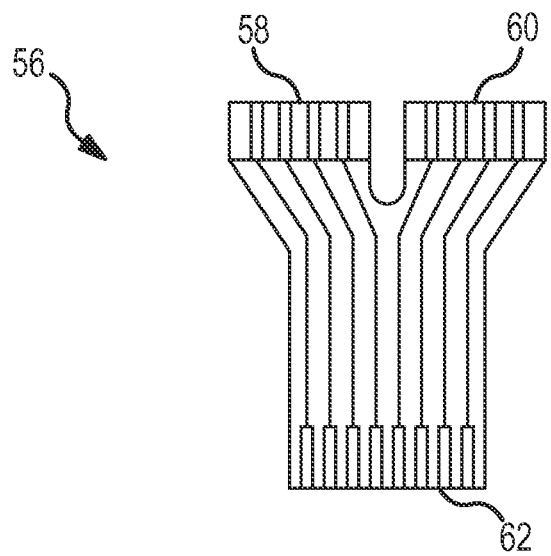
FIG. 3 illustrates a bifurcated flexible printed circuit (FPC) connector for a touch panel assembly.
Figure 4:
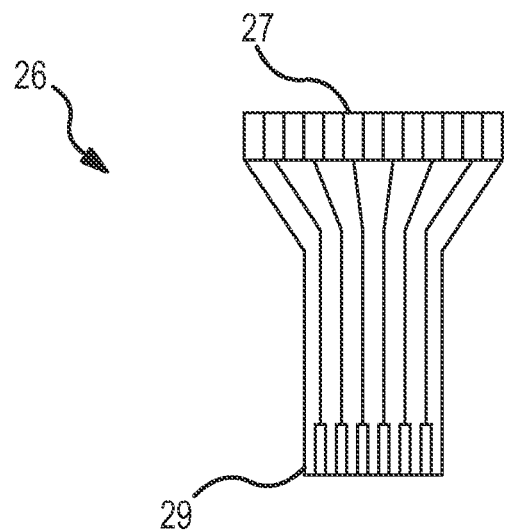
FIG. 4 illustrates another flexible printed circuit (FPC) connector for a touch panel assembly.

As a result during manufacturing, the single, normal FPC connector 166 (e.g., as in FIG. 6B) may be appropriately bonded to only the metal traces 164 (instead of both metal traces 162, 164), which greatly reduces the complexity of the manufacturing process over the prior art panels 10, 40 shown in FIGS. 1-2. For instance and as can be seen with reference to FIGS. 6B-6C, the first set of pads 168a of the FPC connector 166 may be electrically connected to the first set of metal traces 165a and the second set of pads 168b of the FPC connector 166 may be electrically connected to the second set of metal traces 165b that are not electrically connected to any rows of the electrodes on the bottom glass substrate 154.

Figure 7:
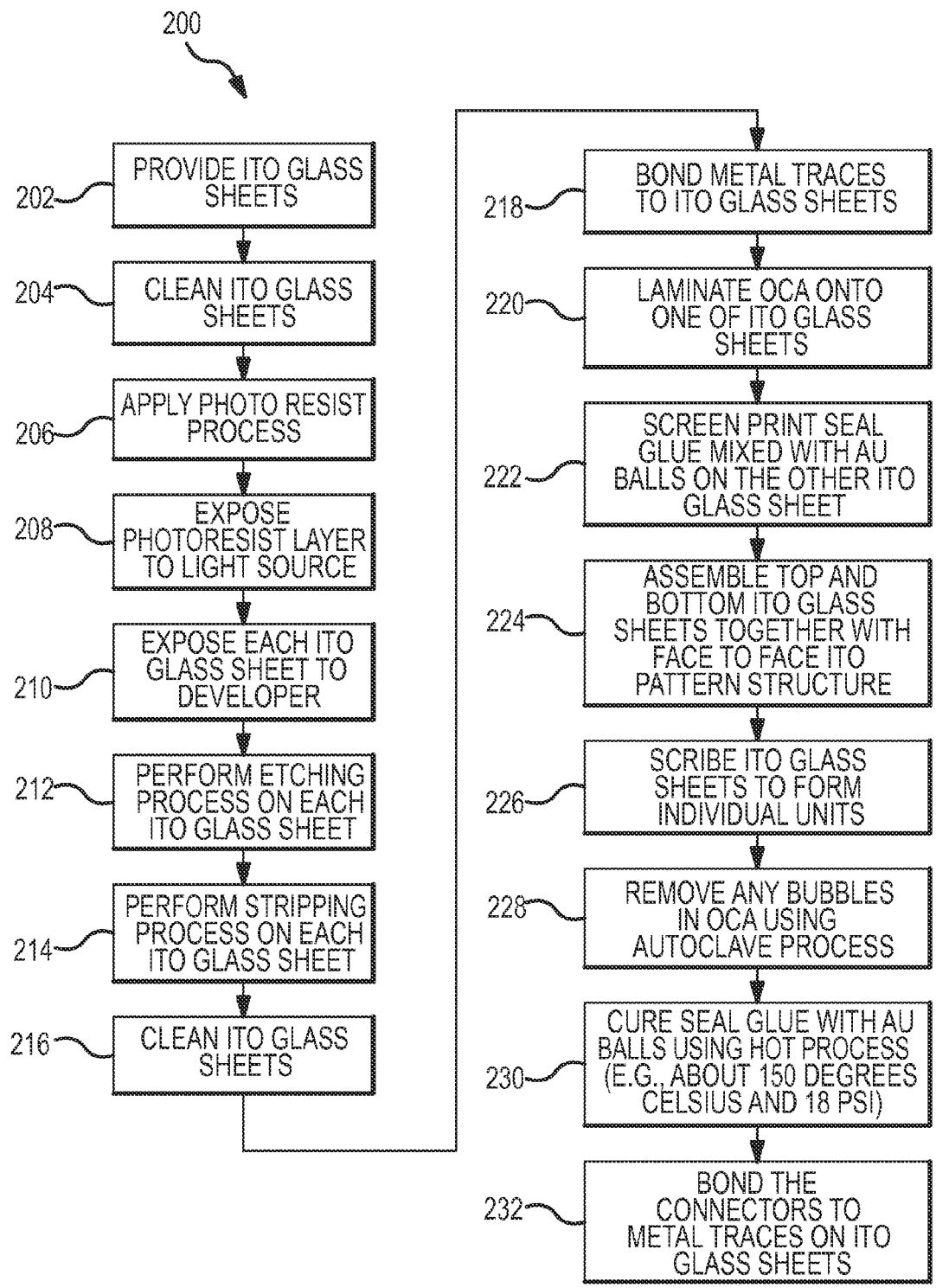
FIG. 7 illustrates a method of manufacturing an exemplary touch panel assembly.
Figure 8:
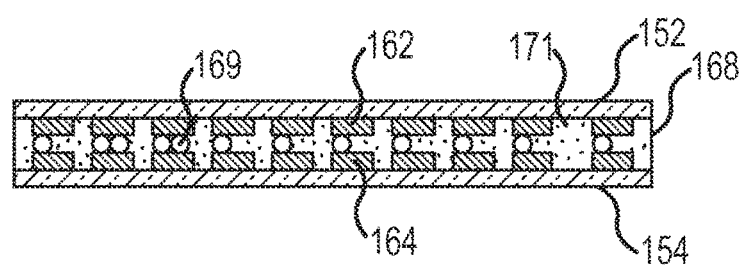
FIG. 8 is a cross-sectional view taken along the line 8-8 in FIG. 6A.

FIG. 7 illustrates a method (200) for manufacturing a touch panel, such as the touch panel 150 shown in FIGS. 6A-6C. The method may begin by providing (202) a top and bottom sheet of ITO coated glass (e.g., the top and bottom glass substrates 152 and 154 shown in FIG. 6A). The sheets may be sized such that several individual touch panels may be made from the two sheets. For example, the surface area of each sheet (e.g., 14"×16") may be several multiples of the surface area for each individual touch panel (e.g., 2"×3"). Each of the top and bottom glass sheets may be cleaned (204) in any appropriate manner or with any appropriate solution (e.g., isopropyl alcohol, ethyl alcohol, trichlorotriflorothane), and then a photo resist process may be applied (206) to each of the top and bottom glass sheets. For instance, a photoresist layer such as diazonaphthoquinone (DNQ), various bisphenols, and the like may be appropriately applied to one surface to each of the sheets. Each sheet can be covered with the photoresist layer by spin coating, prebaking, and/or other appropriate processes to form a desired thickness.

The photoresist layer may be exposed (208) to an appropriate pattern of a light source (e.g., UV light) to chemically change a desired pattern of the photoresist layer. For instance, those portions of the photoresist layer exposed to UV light in a positive photoresist process will become soluble in a developer and can be removed as will be later described. Alternatively, those portions of the photoresist layer exposed to UV in a negative photoresist process will become insoluable in the developer and thus those portions of the photoresist layer not exposed to the UV light can be removed. Thus, depending upon which type of photoresist process used (e.g., positive or negative), a mask other appropriate layer can be disposed between the photoresist layer and the UV light source to form an appropriate pattern in the photoresist layer. The mask can have apertures or "cut-outs" therethrough in a pattern that will eventually allow a desired pattern of electrodes to be formed on the sheets. Thus, assuming a positive photoresist process is used, the portion of the UV light that shines through the apertures of the mask will cause those portions of the photoresist layer that absorb the UV light to become insoluble.

After the photoresist layer has been exposed to UV light, the sheet can be appropriately exposed (210) to a chemical developer (e.g., mixture of Metol, Phenidone or Dimezone and hydroquinone) to remove those portions of the photoresist layer that absorbed the UV light (assuming a positive photoresist process). Those portions of the ITO layer of the upper and lower sheets not protected by the photoresist layer can be etched (212) using for instance a liquid ("wet") or plasma ("dry") chemical agent. Finally, the remaining portions of the photoresist layer can be removed by way of a stripping process (214). For instance, a "resist stripper" can be used which chemically alters the remaining photoresist layer so that it no longer adheres to the sheets. Alternatively, the photoresist layer may be removed by a plasma containing oxygen which oxidizes the photoresist layer in a process called "ashing". Each of the sheets can then be appropriately cleaned (216). At this point, each of the sheets has an appropriately formed ITO electrode pattern or ITO coated surface formed thereon (e.g., that in FIG. 6B) that may be in the form of one or more rows of electrodes (e.g., four rows). Each row of electrodes may include a number of square, diamond or other appropriately shaped electrodes.

After ITO patterns have been formed on each of the sheets, metal traces may be appropriately incorporated (218) with each of the top and bottom sheets. For instance and in the embodiment illustrated in FIGS. 6A-6C, first and second sets of metal traces may be appropriately applied to each of the top and bottom sheet, each of the first and second sets of metal traces including four metal traces. Each metal trace of each first set of four metal traces on the top and bottom sheets can be appropriately electrically connected to a respective row of electrodes (e.g., the first set of traces of the top sheet being electrically connected to rows of electrodes of the top sheet and the first set of traces of the bottom sheet being electrically connected to rows of electrodes of the bottom sheet) while the second sets of four metal traces are not electrically connected to any ITO electrode patterns of the top or bottom sheets. In one embodiment, one of the top and bottom sheets need only be connected to a single set of metal traces, each metal trace of which is connected to a respective ITO electrode pattern on such top and/or bottom sheet. In other embodiments, the metal traces may be appropriately mounted to the top and bottom sheets before the electrode patterns are formed on the top and bottom glass sheets. Thereafter, the previously discussed process may be performed to form electrode patterns, at least some of which are aligned and/or coupled to the metal traces.

Following addition of the metal traces to the top and bottom sheets, an OCA (e.g., an optically clear laminating adhesive sold by 3M Electronics) may be laminated (220) onto the ITO pattern of one of the top and bottom glass sheets (e.g., the top glass sheet). An electrically conductive adhesive (e.g., seal glue with Au balls) may then be appropriately applied (e.g., via screen printing) onto the metal traces (e.g., the first and second sets of metal traces) of the bottom glass sheet (222). As illustrated in FIG. 8 (a cross-sectional view along the lines 8-8 of FIG. 6A), seal glue with Au balls may be applied over the metal traces 164 on the bottom glass sheet 154 such that at least one Au ball 169 is in contact with each of the metal traces 164. Moreover, a trace gap 171 may be designed to be a number of orders larger than the diameter of each Au ball 169. In one embodiment, the trace gap 171 may be approximately 0.15 mm while the diameter of each Au ball 169 may be approximately 35 micrometers. As a result, Au balls 169 that do not remain on the metal traces will fall into or otherwise be disposed within the trace gaps 171 for reasons and advantages that will be described below.

Subsequently, the top and bottom sheets may be assembled together (224) such that the top and bottom ITO patterns are arranged in a face-to-face manner. For instance, the top and bottom sheets may be arranged such that each trace of the first set of metal traces (e.g., four traces) of the top sheet is in a respective face to face and aligned relationship with each trace of the second set of metal traces (e.g. four metal traces) on the bottom glass sheet. Also, the top and bottom sheets may also be arranged such that each trace of the second set of metal traces of the top sheet is in a respective face to face and aligned relationship with each trace of the first set of metal traces of the bottom glass sheet. At this point, each of the metal traces of the top sheet will be aligned with a respective metal trace of the bottom sheet as previously described and will be in electrical contact via at least one Au ball. Excess Au balls in the seal glue with Au ball mixture will fall or otherwise be disposed into and/or within the trace gaps to prevent or otherwise reduce short circuit situations. Also, the OCA serves to bond the top ITO pattern of the top glass sheet to the bottom ITO pattern of the bottom glass sheet.

Once the top and bottom sheets are fixed to each other, they may be scribed (226) to form individual touch panels. For example, the top and bottom sheets may have dimensions of about 14"×16", whereas each individual unit may be much smaller (e.g., 2"×3") such that several individual touch panels may be cut (e.g., using scribing equipment that includes a diamond-edged cutting surface) from a single pair of top and bottom ITO sheets. Once the individual units have been formed, it may be desirable to remove (228) any bubbles that are present in the OCA or other agent bonding the top and bottom substrates to each other. Bubbles in the OCA are undesirable because they may cause visual blemishes in the resulting display device, and therefore touch panels with bubbles in the OCA may have to be discarded. For instance, the units may be placed in an autoclave for an appropriate period of time at an appropriate temperature and pressure (e.g., 50 minutes at 50 degrees Celsius and 5 standard atmospheres (atm)). Performing the autoclave process after forming the individual touch screen units from the larger sheets may increase bubble removal as compared to performing the autoclave process on the larger sheets (e.g., before scribing or otherwise forming the individual units). However, other manners of removing bubbles from the OCA are contemplated.

The next step is to cure (230) the conductive adhesive (e.g., seal glue with Au balls) using a high temperature and pressure process so that the conductive adhesive forms a reliable connection between the above-described metal traces associated with the top and bottom glass sheets or substrates. For example, the individual units may be placed into a container at an appropriate temperature (e.g., 150 degrees Celsius) and an appropriate force may be applied (e.g., 18 psi). Finally, first and second sets of pads of a single non-bifurcated FPC connector (e.g., that of FIG. 6A) may be respectively bonded (232) to the first and second sets of metal traces positioned at the edge of the bottom glass sheet (e.g., the first and second sets of metal traces 165a, 165b shown in FIGS. 6A-6B) via a conductive adhesive (e.g., anistropic conductive film). As described above, the FPC connector may be bonded to the metal traces by positioning the pads of the FPC connector over the metal traces of the bottom sheet and then pressing a hot bar onto the top surface of the FPC connector for several seconds such that the pads of the FPC connector are in contact with the metal traces of the bottom sheet. Once the FPC connector has been bonded to the bottom sheet, the individual touch panel is ready to be integrated into a device that utilizes a touch screen. While the above method (200) has been described with the pads of the FPC connector being directly bonded to the metal traces of the bottom sheet, it is envisioned that the FPC connector could be directly bonded to the metal traces of the top sheet. In other embodiments, the top sheet may include only a single set of four traces that are directly electrically connected to rows of electrodes on the top sheet. Other arrangements are also envisioned so long as the top and bottom sheets are not electrically connected with each other which may destroy or at least inhibit the capacitive coupling effect of the touch screen assembly.

Figure 9:
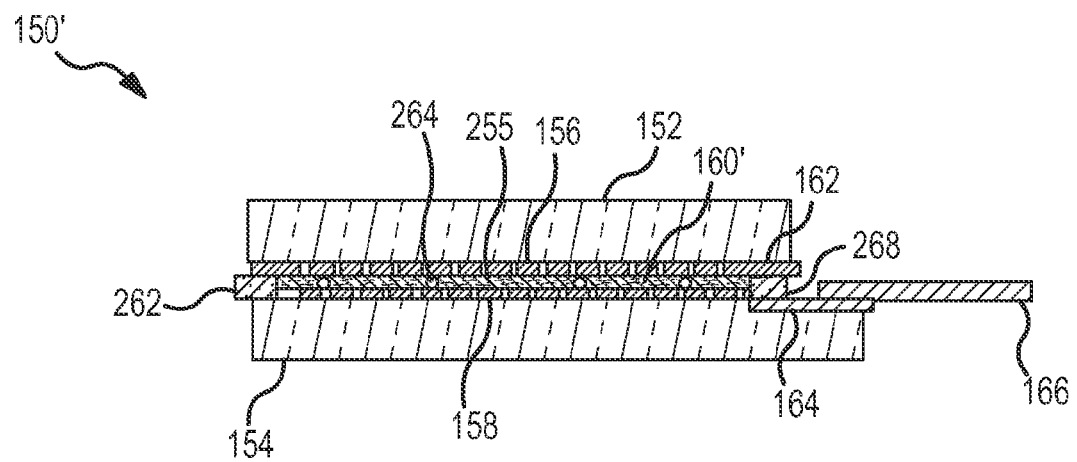
FIG. 9 illustrates another embodiment of a touch panel assembly.
Figure 10:
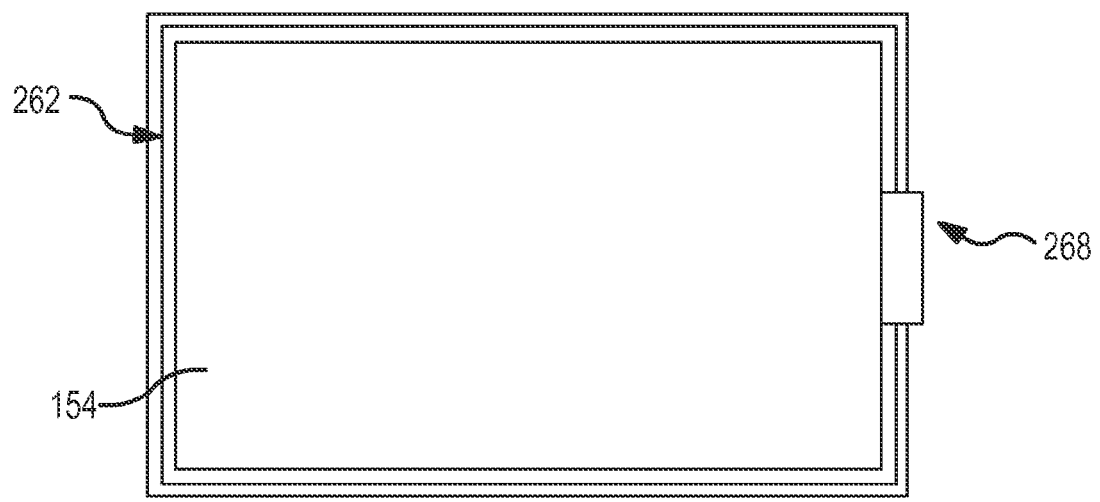
FIG. 10 illustrates a top view of a bottom glass substrate of the touch panel of FIG. 9.

FIGS. 9-10 present a variation of the touch panel 150 of FIGS. 6A-6C and corresponding components between the two embodiments are identified by a common reference numeral. Those corresponding components that differ in at least some respect are identified by a "single prime" designation in FIGS. 9-10. In this embodiment, the bonding agent between the top and bottom glass substrates 152, 154 of the touch panel 150' may be in the form of a liquid crystal 160' instead of the OCA 160, and a number of spacers 264 may be disposed within the liquid crystal 160' to maintain a gap 255 between the top and bottom glass substrates 152, 154.

The spacers 264 may be any appropriate object or device that can maintain the dielectric effect between the top and bottom ITO patterns 156, 158. In some embodiments, the spacers 264 may be in the form of a number of glass and/or plastic balls that may be appropriately applied (e.g., via spraying) onto the surface one of the top and bottom substrates 152, 154 (e.g., top or bottom ITO layers 156, 158) before the top and bottom substrates 152, 154 are placed in the face-to-face relationship during the manufacturing process. While plastic balls may provide increased integrity in both low and high temperatures and reduce production costs, the use of glass balls may facilitate maintaining a desired gap 255 as glass has increased rigidity and robustness. Further, each of the spacers 264 may be of any appropriate size. In one arrangement, the spacers 264 may be substantially smaller than a width of the electrodes. For example, one or more of the spacers 264 may be between 3 and 30 microns in diameter. In another arrangement, the spacers 264 may be between 6 and 20 microns in diameter.

After the spacers 264 have been applied to at least one of the top and bottom substrates 152, 154 and the top and bottom substrates 152, 154 have been placed in a parallel and adjoining relationship such that the top and bottom ITO layers 156, 158 and the metal traces 162, 164 face each other in the manner described in the method of FIG. 7, any appropriate seal may be formed around a perimeter of the assembly 250. For instance, a seal frit 262 of a seal glue with Au balls may be applied or otherwise deposited (e.g., by screen printing) around a perimeter of the touch screen 150'. Although at least the majority of the seal frit 262 may be allowed to harden in any appropriate manner (e.g., drying, curing), an aperture (not shown) may be formed in the seal frit 262 or at least left around the perimeter of the assembly touch screen 150' to allow for the introduction of the liquid crystal 160' into the gap 255 so as to at least partially surround or encompass the spacers 264.

To achieve a high transparency and eliminate or at least reduce Newton Ring effects, the liquid crystal 160' may be chosen to have a refractive index that is the same as, or close to that of the top and bottom substrates 152, 154. Moreover, increasing or decreasing the size of the gap 255 (e.g., by changing the size of the spacers 264) can correspondingly provide a desired capacitance of the touch screen. After the liquid crystal 160' has been deposited between the top and bottom substrates 152, 154, an end seal 268 of any appropriate material (e.g., an electrically conductive adhesive) may be deposited within or at least over the aperture to seal the liquid crystal 160' within the perimeter of the touch screen 150'. While liquid crystal 160' has been described as being deposited between the top and bottom substrates 152, 154, it is contemplated that other bonding agents (e.g., liquid glue) could be used additionally or alternatively. It may be necessary to apply a UV light source to the touch screen 150' if a liquid glue is utilized.

In another embodiment, the spacers 264 may be applied to one of the top and bottom substrates 152, 154 and the seal frit 262 may be applied around the perimeter of one of the top and bottom substrates 152, 154 (either the same substrate that the spacers 264 are applied to or the other of the top and bottom substrates 152, 154) with an aperture being appropriately formed in the seal frit 262. Thereafter, the top and bottom substrates 152, 154 may be appropriately brought into the aforementioned parallel and adjoining face-to-face relationship and bonded together and the gap 255 filled with the liquid crystal 160' or other bonding agent.

In either arrangement and in addition to serving the function of containing the liquid crystal 160' or other bonding agent between the top and bottom substrates 152, 154, the seal glue with Au balls of the seal frit 262 will be disposed over and between the metal traces 162, 164 of the top and bottom substrates 152, 154 when the top and bottom substrates 152, 154 are brought into the face to face relationship during the manufacturing process. As such, the Au balls may serve to respectively electrically connect each of the metal traces 162 of the top substrate 152 to each of the metal traces of the bottom substrate 154. In this regard and as described with previous embodiments, the top and bottom substrates will not be directly electrically connected and the capacitive coupling effect of the touch screen will be maintained.

It should be appreciated that the structures and methods described herein have several benefits and advantages over the previous designs. First, by using an electrically conductive adhesive to couple metal traces in two different layers, a single, non-bifurcated FPC connector may be used. This advantageously reduces the number of FPC connectors required, the physical space required, and the complexity of the FPC bonding process. Further, by not using a bifurcated FPC connector, the bonding process is further simplified due to the fact that there is no need to bond an FPC connector in two different planes (e.g., two different ITO layers). Another advantage of the present design results from using a face-to-face ITO pattern structure, rather than a face-to-back structure. By doing this, there is no need to use a low resistance ITO layer to increase the signal strength of the bottom ITO pattern, which may cause reduced contrast levels for the resulting display device.

Furthermore, the embodiment shown in FIGS. 9-10 may be implemented as shown or in combination with previously described embodiments and provides several advantages over prior art designs. For example, by matching the refractive index of the liquid crystal 160' (or optical glue) with that of the glass substrates 152, 154, an assembly with high transparency is provided. Further, the spacers 264 may provide a uniform and predetermined gap width and thus reduce the effects of Newton Rings.

While the embodiments have been illustrated and described in detail in the drawings and foregoing description, such illustration and description is to be considered as exemplary and not restrictive in character. For example, the features of at least some of the illustrations (e.g., the gap between top and bottom ITO layers 156, 158 in FIG. 6A) may not be to scale and it should be appreciated that such features may assume any appropriate sizes. As an additional example, certain embodiments described hereinabove may be combinable with other described embodiments and/or arranged in other ways (e.g., process elements may be performed in other sequences). Accordingly, it should be understood that only the preferred embodiment and variants thereof have been shown and described and that all changes and modifications that come within the spirit of the embodiments are desired to be protected.

What is claimed:

1. A capacitive touch screen panel connectable to an external connector, comprising:
   a first transparent substrate that includes a first conductive layer disposed adjacent to a surface thereof, the first conductive layer having:
      a plurality of rows of conductive electrodes formed therein, the electrodes in each row being electrically connected together;
      a plurality of contact pads for connection to the external connector, there being numerically more contact pads than the plurality of rows of electrodes; and
      a plurality of conductive traces, each trace connecting to a different row of electrodes and to a different contact pad;
   a second transparent substrate that includes a second conductive layer disposed adjacent to a surface thereof, the second conductive layer having:
      a plurality of rows of conductive electrodes formed therein, the electrodes in each row being electrically connected together;
      a plurality of contact pads for connection to the external connector, there being numerically more contact pads than the plurality of rows of electrodes; and
      a plurality of conductive traces, each trace connecting to a different row of electrodes and to a different contact pad;
      wherein each conductive trace is connected to a different one of the contact pads; and
   a transparent material disposed between said first and second transparent substrates, such that the first and second conductive layers are arranged in a face-to-face relationship;
   wherein the plurality of contact pads on the first conductive layer are aligned with the plurality of contact pads on the second conductive layer so that each contact pad on one layer has a corresponding contact pad on the other layer, and wherein in each case where a contact pad on one layer is connected to a row of electrodes on that same layer, the corresponding contact pad on the other layer is not connected to a row of electrodes on the other layer.

2. A capacitive touch screen panel as defined in 1, wherein the external connector connects directly to the plurality of contact pads of the first conductive layer.

3. A capacitive touch screen panel as defined in 1, further including a connective coupler that connects at least a portion of the contact pads on one layer to their corresponding contact pads on the other layer.

4. A capacitive touch screen panel as defined in claim 3, wherein the connective coupler includes electrically conductive adhesive.

5. A capacitive touch screen panel as defined in 4, wherein the external connector connects directly to the plurality of contact pads of the first conductive layer.

6. The touch screen panel of claim 1, wherein each of the electrodes in the plurality of rows of electrodes on each of the first and second conductive layers is diamond-shaped.

7. The touch screen panel of claim 1, wherein each of the plurality of rows of electrodes of the first conductive layer is generally perpendicular to each of the plurality of rows of electrodes of the second conductive layer.

8. The touch screen panel of claim 4, wherein the electrically conductive adhesive includes a mixture of epoxy resin and Au balls.

9. The touch screen panel of claim 8, wherein at least one Au ball is disposed between at least one contact pad on the first conductive layer and at least one contact pad on the second conductive layer.

10. The touch screen panel of claim 1, wherein the first and second conductive layers include indium tin oxide (ITO).

* * * * *